(12) United States Patent
Yu et al.

(10) Patent No.: US 8,403,434 B2
(45) Date of Patent: Mar. 26, 2013

(54) MOUNTING APPARATUS FOR SLIDE RAIL (75) Inventors: Mo-Ming Yu, Shenzhen (CN); Ze-Hong Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 109 days.

(21) Appl. No.: 12/979,313

(22) Filed: Dec. 27, 2010

(65) Prior Publication Data

US 2012/0145850 A1    Jun. 14, 2012

(30) Foreign Application Priority Data

Dec. 9, 2010  (CN) .......................... 2010 1 0580880

(51) Int. Cl.
 *A47B 88/00* (2006.01)
(52) U.S. Cl. ............. 312/334.1; 312/334.44; 312/334.5; 312/333; 312/330.1; 248/244
(58) Field of Classification Search ............ 248/220.21, 248/424, 298.1, 220.22, 220.41, 221.11, 248/222.14, 244; 312/334.4, 334.44, 333, 312/334.1, 334.7, 334.45, 334.46, 334.47; 211/26, 183, 192; 403/350, 330; 384/21; 16/94 R See application file for complete search history.

(56) References Cited

U.S. PATENT DOCUMENTS

| | | | | |
|---|---|---|---|---|
| 7,281,694 B2 * | 10/2007 | Allen et al. | .................... | 248/244 |
| 7,703,734 B2 * | 4/2010 | Chen et al. | ................. | 248/298.1 |
| 7,798,582 B2 * | 9/2010 | Yu et al. | ..................... | 312/334.4 |
| 7,988,246 B2 * | 8/2011 | Yu et al. | ..................... | 312/334.4 |
| 8,079,654 B2 * | 12/2011 | Yu et al. | ..................... | 312/334.4 |
| 8,328,300 B2 * | 12/2012 | Yu et al. | ......................... | 312/333 |
| 2005/0218762 A1 * | 10/2005 | Lammens | ................ | 312/334.46 |
| 2008/0122333 A1 * | 5/2008 | Tseng et al. | .................. | 312/333 |
| 2009/0315434 A1 * | 12/2009 | Yu et al. | ..................... | 312/223.2 |
| 2011/0192946 A1 * | 8/2011 | Yu et al. | ..................... | 248/222.11 |
| 2011/0240580 A1 * | 10/2011 | Yu et al. | ......................... | 211/183 |

* cited by examiner

*Primary Examiner* — Todd M Epps
(74) *Attorney, Agent, or Firm* — Altis Law Group, Inc.

(57) ABSTRACT

A mounting apparatus for mounting a slide rail to a bracket with through holes includes a retaining member and a locking member fixed to the retaining member. The retaining member includes a positioning portion, and defines a through slot. The locking member includes an engaging portion and an operating portion extending through the through slot. The positioning portion engages in a through hole of the bracket from a first side of the bracket, the engaging portion engages with a second side of the bracket. When releasing the slide rail from the bracket, the operating portion is operated to deform the locking member to make the engaging portion be disengaged from the second side of the bracket, and the positioning portion is readily released from the through hole of the bracket, to release the retaining member from the bracket.

17 Claims, 6 Drawing Sheets

MOUNTING APPARATUS FOR SLIDE RAIL

BACKGROUND

1. Technical Field

The disclosure relates to mounting apparatuses, and more particularly to a mounting apparatus for mounting a slide rail.

2. Description of Related Art

A slide rail is used between two objects that can move relative to each other, such as between a desk and a drawer, or a server and a rack. A conventional slide rail assembly for a drawer and a desk includes an outer slide rail mounted to the desk, an inner slide rail mounted to the drawer, and an intermediate slide rail mounted between the outer and inner slide rails. The intermediate slide rail is extendable relative to the outer slide rail, and the inner slide rail is extendable relative to the intermediate slide rail, thus the drawer can be extended a short distance out from the desk. A plurality of screws is used for mounting the outer slide rail to the desk. Therefore, installing or uninstalling the outer slide rail to or from the desk is inconvenient and time-consuming.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
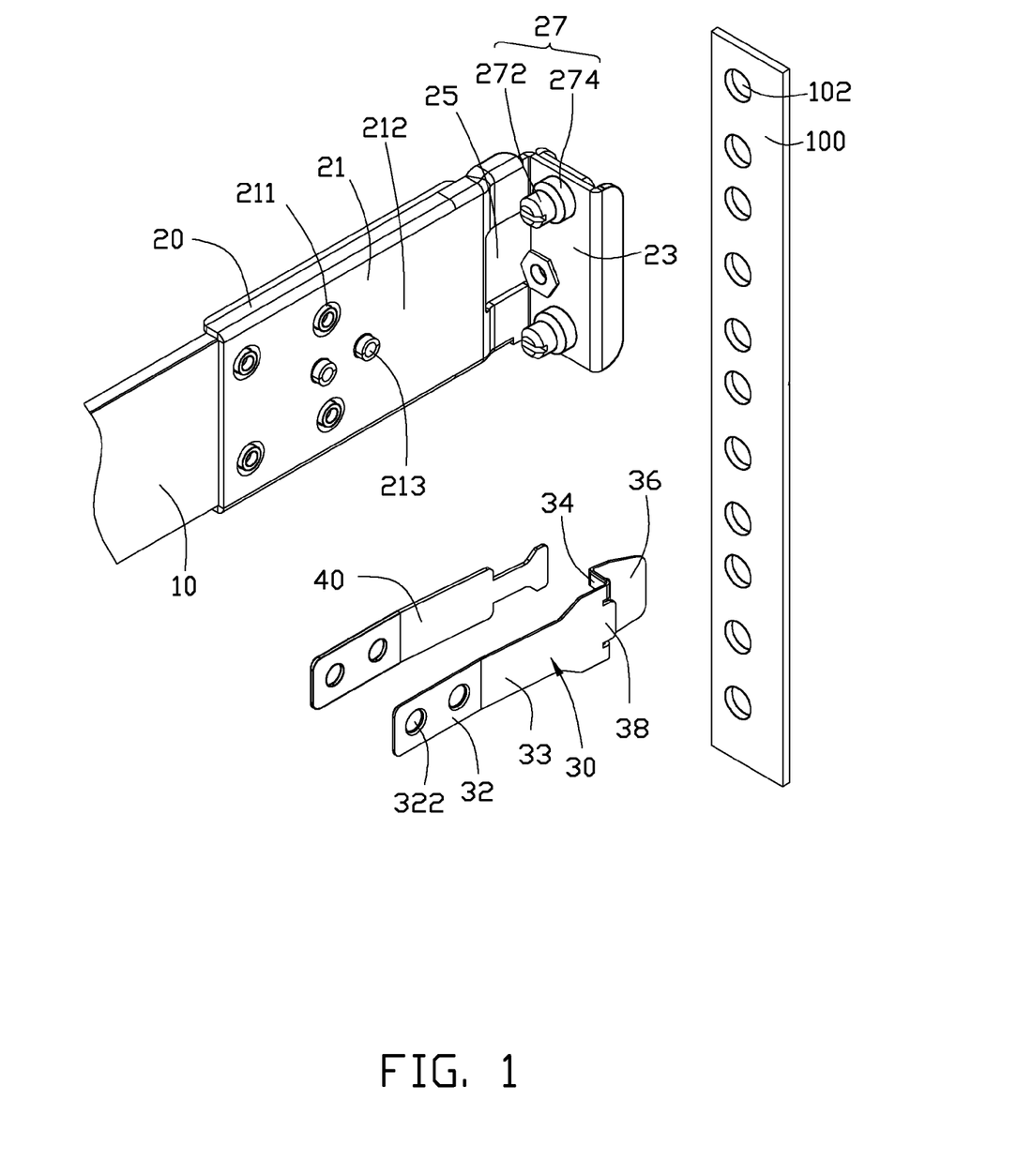
FIG. 1 is an assembled, isometric view of an embodiment of a mounting apparatus for a slide rail, together with a first bracket.
Figure 2:
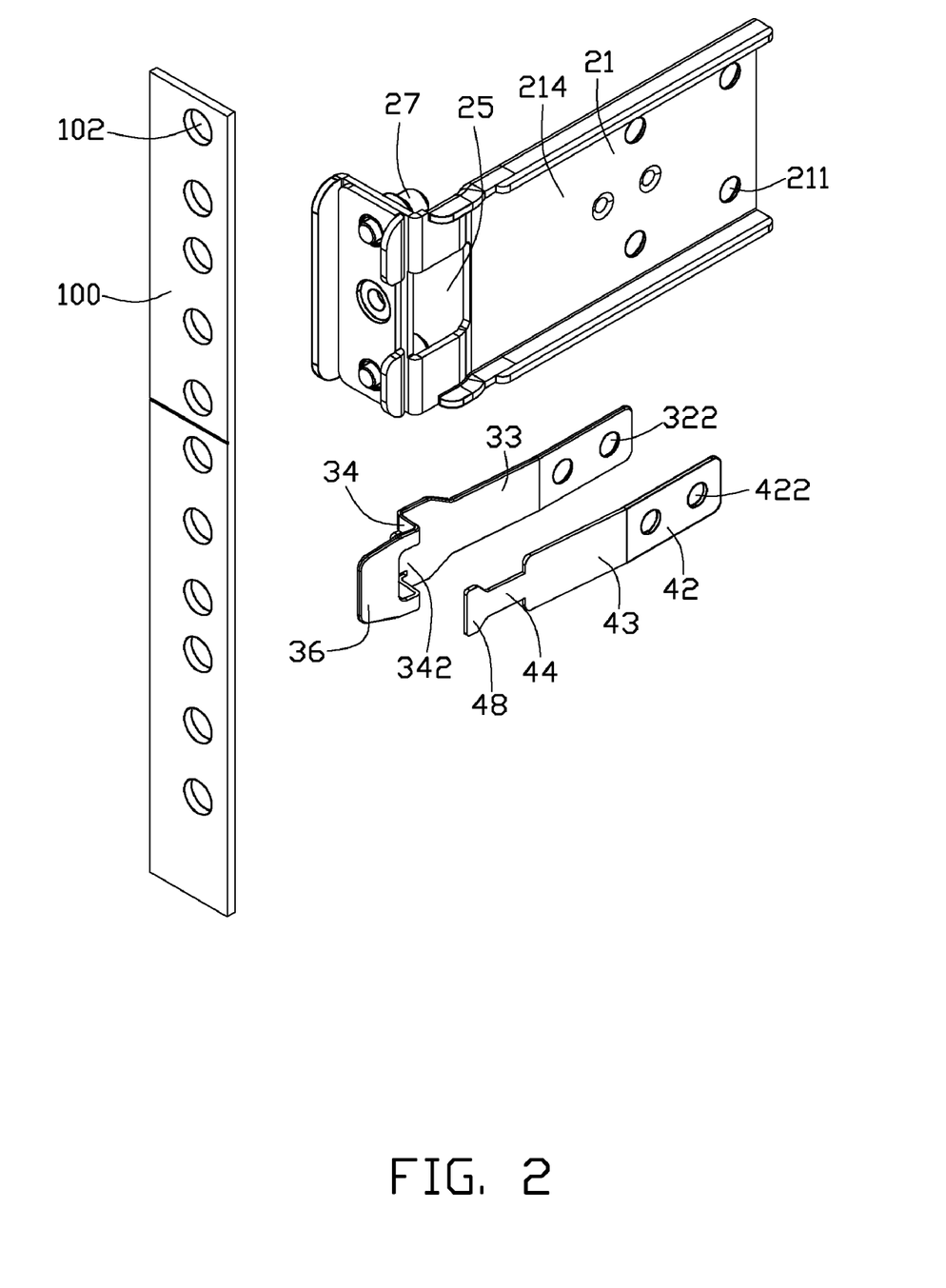
FIG. 2 is similar to FIG. 1, but viewed from another perspective.

Referring to FIGS. 1 and 2, an exemplary embodiment of a mounting apparatus is provided for mounting a slide rail 10 to a first bracket 100. The mounting apparatus includes a retaining member 20, a first locking member 30, and a second locking member 40.

The first bracket 100 defines a plurality of through holes 102 from top to bottom.

The retaining member 20 is substantially L-shaped, and includes a main wall 21, and a sidewall 23 substantially perpendicularly extending from one end of the main wall 21. The main wall 21 includes a first surface 212 and a second surface 214 opposite to the first surface 212. The main wall 21 defines a plurality of mounting holes 211, for mounting the retaining member 20 to an end of the slide rail 10. Two mounting rods 213 extend from the first surface 212 of the main wall 21 opposite to the slide rail 10. The main wall 21 defines a through slot 25 through the first surface 212 and the second surface 214 adjacent to the sidewall 23. Two positioning poles 27 extend inward from the sidewall 23. Each positioning pole 27 is substantially stepped and includes a round first positioning portion 272, and a round second positioning portion 274 extending from the sidewall 23. The first positioning portion 272 extends from the second positioning portion 274. A diameter of the first positioning portion 272 is less than a diameter of the second positioning portion 274.

The first locking member 30 is made by bending a resilient metal piece. The first locking member 30 includes a mounting portion 32, a resilient portion 33 extending from the mounting portion 32 and at an angle to the mounting portion 32, a connecting portion 34 substantially perpendicularly extending from the resilient portion 33, and an operating portion 36 extending from the connecting portion 34 and substantially parallel to the resilient portion 33. The mounting portion 32 defines two mounting holes 322. The connecting portion 34 defines a through hole 342 extending to the resilient portion 33. A first engaging portion 38 extends from a sidewall bounding the through hole 342 of the resilient portion 33, the first engaging portion 38 is substantially parallel to the operating portion 36.

The second locking member 40 is made by bending a resilient metal piece. The second locking member 40 includes a mounting portion 42, a resilient portion 43 extending from the mounting portion 42 and at an angle to the mounting portion 42, a narrow connecting portion 44 extending from the resilient portion 43, and a second engaging portion 48 extending from the connecting portion 44. The mounting portion 42 defines two mounting holes 422.

Figure 3:
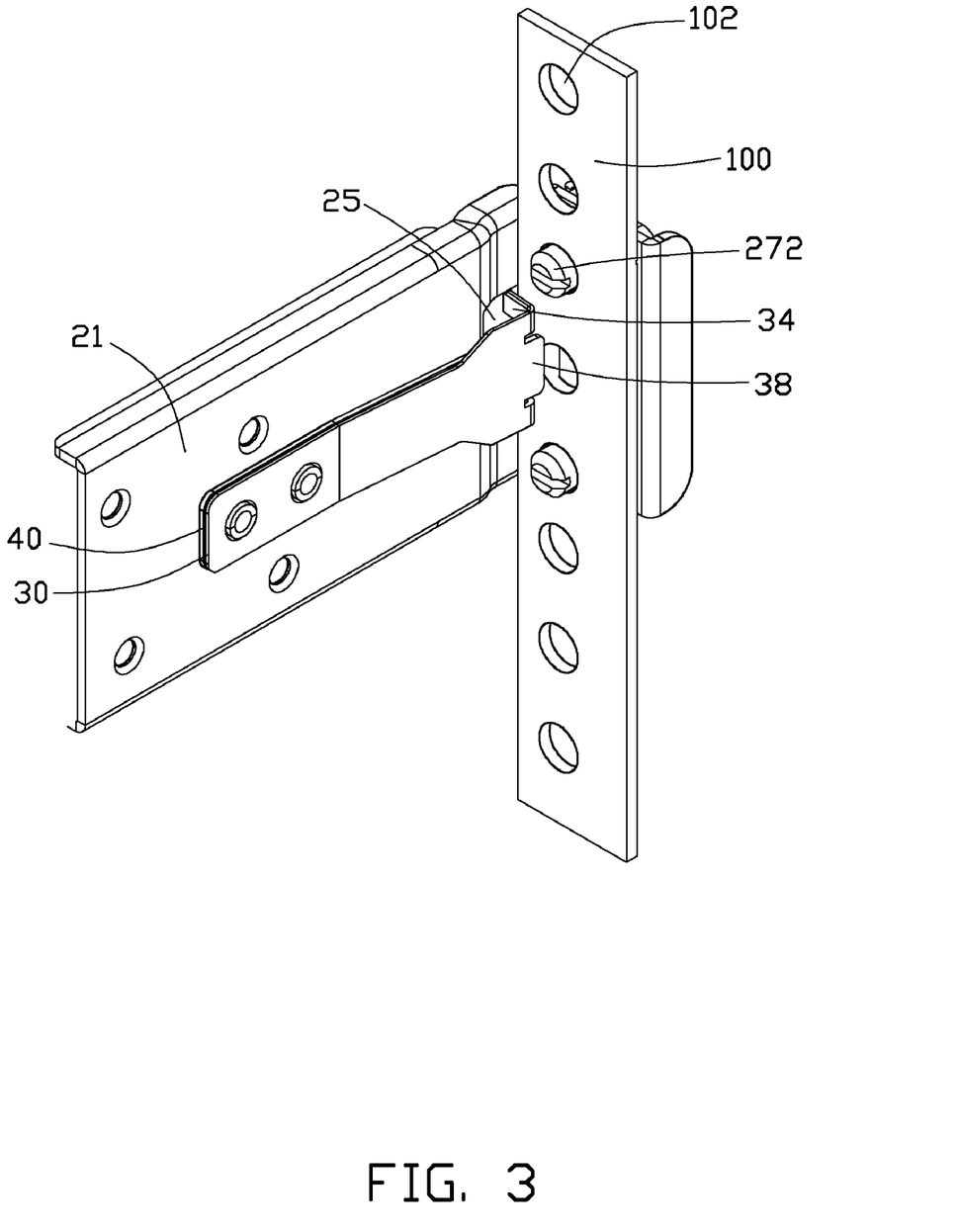
FIG. 3 is an assembled, isometric view of the mounting apparatus of FIG. 1.
Figure 4:
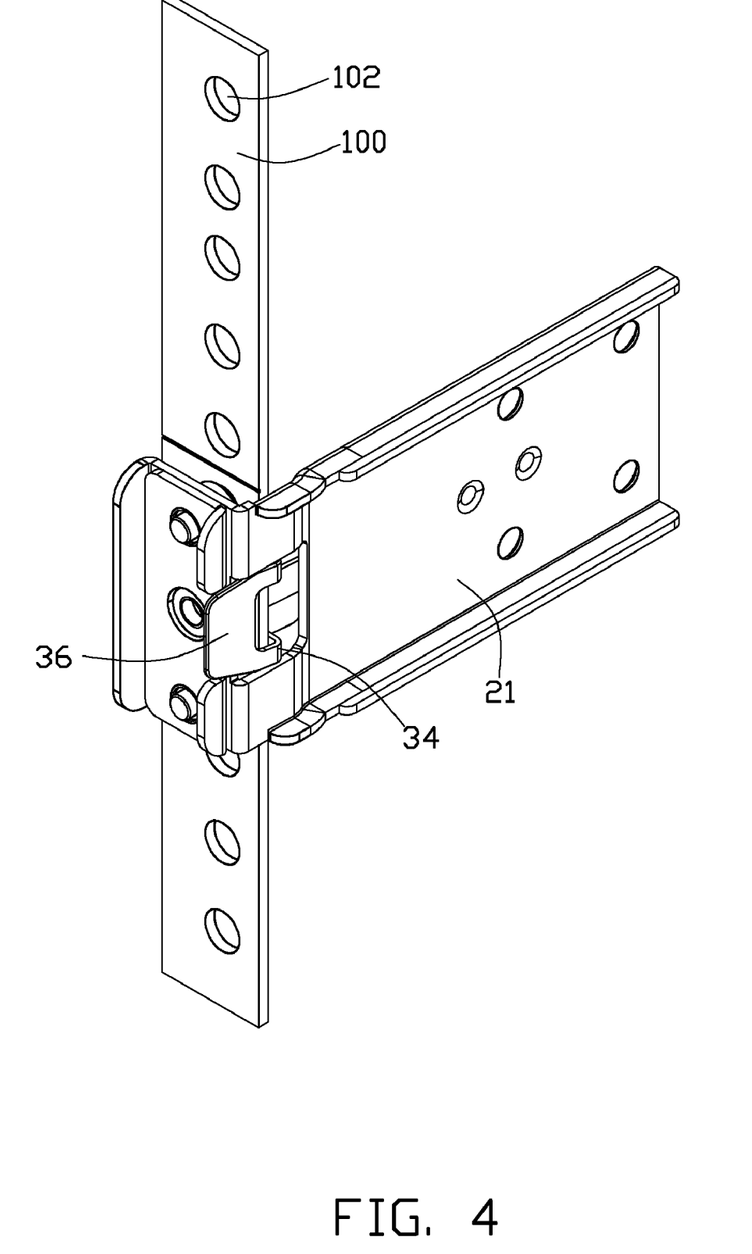
FIG. 4 is an assembled, isometric view of the mounting apparatus of FIG. 2.

Referring to FIGS. 3 and 4, in assembly, the second locking member 40 and the first locking member 30 are orderly fixed to first surface 212 of the main wall 21 of the retaining member 20, through the mounting rods 213 of the retaining member 20 orderly engaging in the mounting holes 422 of the second locking member 40 and the mounting holes 322 of the first locking member 30. The second locking member 40 is positioned between the main wall 21 of the retaining member 20 and the first locking member 30. The second engaging portion 48 of the second locking member 40 extends through the through hole 342 of the first locking member 30. The resilient portion 33 of the first locking member 30 and the resilient portion 43 of the second locking member 40 are angled with the first surface 212 of the main wall 21. The connecting portion 34 of the first locking member 30 extends through the through slot 25 of the retaining member 20 to position the operating portion 36 of the first locking member 30 at the second surface 214 of the retaining member 20.

In mounting the slide rail 10 to the first bracket 100, the operating portion 36 of the first locking member 30 is operated to deform the resilient portion 33 of the first locking member 30 to make the resilient portion 33 of the first locking member 30 and the resilient portion 43 of the second locking member 40 in tight contact with the first surface 212 of the retaining member 20. The first positioning portions 272 of the retaining member 20 engage in two corresponding through holes 102 of the first bracket 100 from a first side of the first bracket 100. The operating portion 36 is released, with the resilient portion 33 of the first locking member 30 restored. Thus the first engaging portion 38 engages with a second side of the first bracket 100 opposite to the first side of the first bracket 100, to avoid the first positioning portions 272 of the retaining member 20 releasing from the though holes 102 of the first bracket 100.

In releasing the slide rail 10 from the first bracket 100, the operating portion 36 of the first locking member 30 is operated to deform the resilient portion 33 of the first locking member 30 to make the resilient portion 33 of the first locking member 30 and the resilient portion 43 of the second locking member 40 in tight contact with the first surface 212 of the retaining member 20. Thus the first engaging portion 38 can be disengaged from the first surface 212 of the retaining member 20, and the first positioning poles 27 of the retaining member 20 are readily removed from the through holes 102 of the first bracket 100, to release the retaining member 20 from the first bracket 100.

Figure 5:
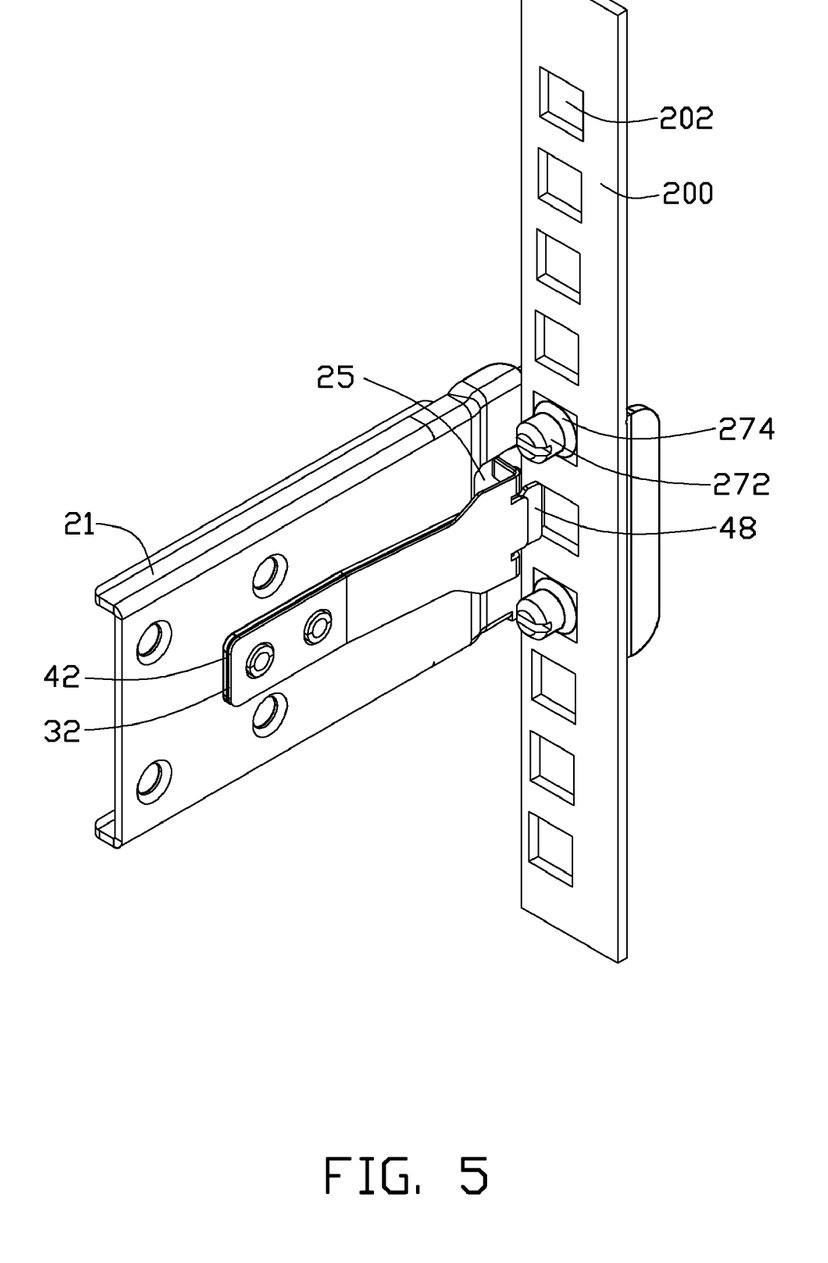
FIG. 5 is an assembled, isometric view of the mounting apparatus of FIG. 1, together with a second bracket.
Figure 6:
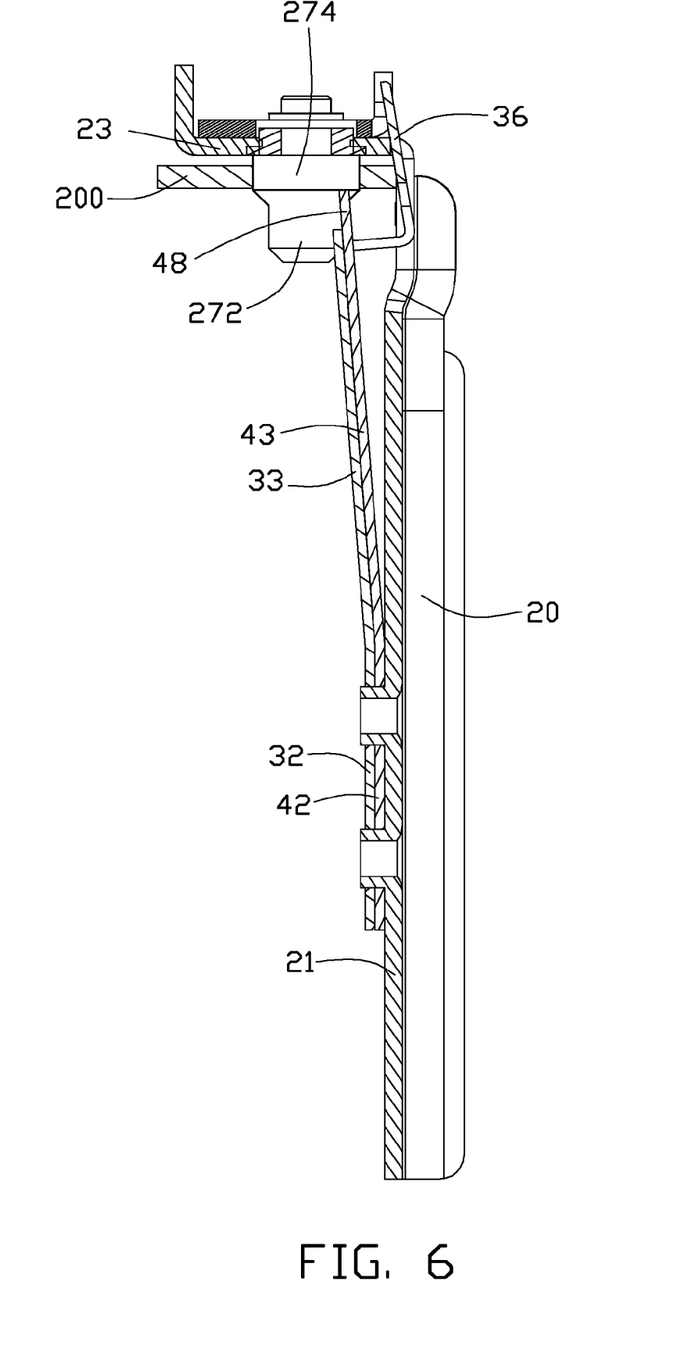
FIG. 6 is a cross-sectional view of FIG. 5.

Referring to FIGS. 5 and 6, in mounting the slide rail 10 to a second bracket 200 which defines a plurality of rectangle-shaped through holes 202, the operating portion 36 of the first locking member 30 is operated to deform the resilient portion 33 of the first locking member 30 to make the resilient portion 33 of the first locking member 30 and the resilient portion 43 of the second locking member 40 in tight contact with the first surface 212 of the retaining member 20. The second positioning portions 274 of the retaining member 20 engage in two corresponding through holes 202 of the second bracket 200 from a first side of the second bracket 200. The operating portion 36 is released, with the resilient portion 33 of the first locking member 30 restored. Thus the second engaging portion 48 engages with a second side of the second bracket 200 opposite to the first side of the second bracket 200, to avoid the second positioning portions 274 of the retaining member 20 releasing from the though holes 202 of the second bracket 200.

In releasing the slide rail 10 from the second bracket 200, the operating portion 36 of the first locking member 30 is operated to deform the resilient portion 33 of the first locking member 30 to make the resilient portion 33 of the first locking member 30 and the resilient portion 43 of the second locking member 40 in tight contact with the first surface 212 of the retaining member 20. Thus the second engaging portion 48 can be disengaged from the second side of the second bracket 200, and the second positioning portions 274 of the retaining member 20 are readily removed from the through holes 202 of the second bracket 200, to release the retaining member 20 from the second bracket 200.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus for mounting a slide rail to a bracket, the bracket defines a plurality of through holes, the mounting apparatus comprising:

a retaining member comprising a main wall to be fixed to the slide rail with a first end, and a sidewall substantially perpendicularly extending from a second end of the main wall opposite to the first end, a first positioning portion extending from the sidewall, a through slot defined in the main wall adjacent to the sidewall; and a first locking member comprising a first mounting portion fixed to the main wall, a first resilient portion extending from the first mounting portion and at an angle to the first mounting portion, a first connecting portion extending from the first resilient portion, and an operating portion extending from the first connecting portion, a first engaging portion extending from the first resilient portion, the first connecting portion and the operating portion of the first locking member extending through the through slot of the retaining member;

wherein the first positioning portion of the retaining member engages in a corresponding one of the plurality of through holes of the bracket from a first side of the bracket, the first engaging portion engages with a second side of the bracket opposite to the first side of the bracket; and wherein when to release the slide rail from the bracket, the operating portion of the first locking member is operated to deform the resilient portion of the first locking member to make the first engaging portion be disengaged from the second side of the bracket, and the first positioning portion of the retaining member is readily removed from the through hole of the bracket, to release the retaining member from the bracket.

2. The mounting apparatus as described in claim 1, further comprising a second locking member fixed to the main wall of the retaining member and positioned between the main wall and the first locking member.

3. The mounting apparatus as described in claim 2, wherein the second locking member is made by bending a resilient metal piece.

4. The mounting apparatus as described in claim 2, wherein the connecting portion of the first locking member defines a through hole, the first engaging portion of the first locking member extends through the through hole of the first locking member.

5. The mounting apparatus as described in claim 2, wherein the second locking member comprises a second mounting portion fixed to the main wall of the retaining member, a second resilient portion extending from the second mounting portion and at an angle to the second mounting portion, a second connecting portion extending from the second resilient portion, and a second engaging portion extending from the connecting portion.

6. The mounting apparatus as described in claim 5, wherein the first connecting portion of the first locking member defines a through hole, the second engaging portion of the second locking member extends through the through hole of the connecting portion of the first locking member.

7. The mounting apparatus as described in claim 1, wherein the first connecting portion of the first locking member is substantially perpendicular to the first resilient portion of the first locking member.

8. The mounting apparatus as described in claim 1, wherein the first locking member is made by bending a resilient metal piece.

9. A mounting apparatus for selectively mounting a slide rail to a first bracket or a second bracket, the first bracket defines a plurality of first through holes, the second bracket defines a plurality of second through holes, the mounting apparatus comprising:

a retaining member comprising a main wall to be fixed to the slide rail with a first end, and a sidewall substantially perpendicularly extending from a second end of the main wall opposite to the first end, a through slot defined in the main wall adjacent to the sidewall, a positioning pole extending from the sidewall, the positioning pole comprising a first positioning portion, and a second positioning portion connected between the sidewall and the first positioning portion;

a first locking member comprising a first mounting portion fixed to the main wall, a first resilient portion extending from the first mounting portion and at an angle to the first mounting portion, a first connecting portion extending from the first resilient portion, and an operating portion extending from the first connecting portion, a first engaging portion extending from the first resilient portion, the first connecting portion of the first locking member extending through the through slot of the retaining member; and a second locking member comprising a second mounting portion fixed to the main wall of the retaining member, a second resilient portion extending from the second mounting portion and at an angle to the second mounting portion, a second connecting portion extending from the second resilient portion, and a second engaging portion extending from the second connecting portion;

wherein when mounting the slide rail to the first bracket, the first positioning portion of the retaining member engages in a corresponding one of the plurality of first through holes of the first bracket from a first side of the first bracket, the first engaging portion engages with a second side of the first bracket opposite to the first side of the first bracket;

wherein when releasing the slide rail from the first bracket, the operating portion of the first locking member is operated to deform the first resilient portion of the first locking member to make the first engaging portion be disengaged from the second side of the first bracket, and the first positioning position of the retaining member is readily removed from the first through hole of the first bracket, to release the retaining member from the first bracket;

wherein when mounting the slide rail to the second bracket, the second positioning portion of the retaining member engages in a corresponding one of the plurality of second through holes of the second bracket from a first side of the second bracket, the second engaging portion engages with a second side of the second bracket opposite to the first side of the second bracket; and wherein when releasing the slide rail from the second bracket, the operating portion of the first locking member is operated to deform the first resilient portion of the first locking member and the second resilient portion of the second locking member to make the second engaging portion be disengaged from the second side of the second bracket, and the second positioning portion of the retaining member is readily removed from the second through hole of the second bracket, to release the retaining member from the second bracket.

10. The mounting apparatus as described in claim 9, wherein a diameter of the first positioning portion is less than a diameter of the second positioning portion.

11. The mounting apparatus as described in claim 9, wherein the second locking member is sandwiched between the main wall and the first locking member.

12. A mounting apparatus for selectively mounting a slide rail to a first bracket or a second bracket, the first bracket defines a plurality of first through holes, the second bracket defines a plurality of second through holes, the mounting apparatus comprising:

a retaining member comprising a main wall to be fixed to the slide rail with a first end, and a sidewall substantially perpendicularly extending from a second end of the main wall opposite to the first end, the main wall comprises a first surface and a second surface opposite to the first surface, a through slot defined in the main wall adjacent to the sidewall, a positioning pole extending from the sidewall, the positioning pole comprising a first positioning portion, and a second positioning portion connected between the sidewall and the first positioning portion;

a first locking member fixed to the first surface of the main wall, the first locking member comprising a first engaging portion and an operating portion extending through the through slot of the main wall of the retaining member and positioned in the second surface of the main wall of the retaining member, and a second locking member fixed to the first surface of the main wall and sandwiched between the first locking member and the main wall of the retaining member, the second locking member comprising a second engaging portion;

wherein when mounting the slide rail to the first bracket, the first positioning portion of the retaining member engages in a corresponding one of the plurality of first through holes of the first bracket from a first side of the first bracket, the first engaging portion engages with a second side of the first bracket opposite to the first side of the first bracket;

wherein when releasing the slide rail from the first bracket, the operating portion of the first locking member is operated to deform the first locking member and the second locking member to make the first engaging portion be disengaged from the second side of the first bracket, and the first positioning portion of the retaining member is readily disengaged from the first through hole of the first bracket, to release the retaining member from the first bracket;

wherein when mounting the slide rail to the second bracket, the second positioning portion of the retaining member engages in a corresponding one of the plurality of second through holes of the second bracket from a first side of the second bracket, the second engaging portion engages with a second side of the second bracket opposite to the first side of the second bracket; and wherein when releasing the slide rail from the second bracket, the operating portion of the first locking member is operated to deform the first locking member and the second locking member to make the second engaging portion be disengaged from the second side of the second bracket, and the second positioning portion of the retaining member is readily disengaged from the second through hole of the second bracket, to release the retaining member from the second bracket.

13. The mounting apparatus as described in claim 12, wherein the second locking member further comprises a first mounting portion fixed to the main wall of the retaining member, a first resilient portion extending from the first mounting portion and at an angle to the first mounting portion, and a first connecting portion extending from the first resilient portion, the second engaging portion extends from the first connecting portion.

14. The mounting apparatus as described in claim 13, wherein the first locking member further comprises a second mounting portion fixed to the first mounting portion of the second locking member, a second resilient portion extending from the second mounting portion and at an angle to the second mounting portion, and a second connecting portion extending from the second resilient portion, the operating portion extends from the second connecting portion, the first engaging portion extends from the second resilient portion, the second connecting portion of the first locking member extends through the through slot of the retaining member.

15. The mounting apparatus as described in claim 14, wherein the second connecting portion of the first locking member is substantially perpendicular to the second resilient portion of the first locking member.

16. The mounting apparatus as described in claim 14, wherein the second connecting portion of the first locking member defines a through hole, the first engaging portion of the first locking member extends from a sidewall bounding the through hole of the first locking member.

17. The mounting apparatus as described in claim 16, wherein the second engaging portion of the second locking member extends through the through hole of the second connecting portion of the first locking member.

* * * * *